United States Patent [19]
Neu et al.

[11] Patent Number: 6,036,173
[45] Date of Patent: Mar. 14, 2000

[54] SEMICONDUCTOR ELEMENT HAVING A CARRYING DEVICE AND A LEAD FRAME AND A SEMICONDUCTOR CHIP CONNECTED THERETO

[75] Inventors: Achim Neu, Regensburg; Thies Janczek, Molfsee; Günter Tutsch, Saal, all of Germany

[73] Assignee: Siemens Aktiengesellschaft, Munich, Germany

[21] Appl. No.: 09/200,070

[22] Filed: Nov. 25, 1998

[30] Foreign Application Priority Data

Nov. 25, 1997 [DE] Germany .......................... 197 52 195

[51] Int. Cl.⁷ ................................... H01L 23/495
[52] U.S. Cl. .......................... 251/668; 257/666; 257/676; 257/670; 257/690; 257/787; 257/771
[58] Field of Search ................................... 257/668, 666, 257/676, 670, 690, 787, 771

[56] References Cited

U.S. PATENT DOCUMENTS 5,227,232  7/1993  Lim .......................................... 257/668
5,811,790  9/1998  Endo et al. ........................... 250/208.1

*Primary Examiner*—Tom Thomas
*Assistant Examiner*—Luan Thai
*Attorney, Agent, or Firm*—Herbert L. Lerner; Laurence A. Greenberg

[57] ABSTRACT

A semiconductor component has a semiconductor chip, connection elements, and a housing made of a molding compound. The semiconductor chip has contact pads on a top side. The contact pads are electrically connected to the connection elements via bonding wires. The connection elements overlap the semiconductor chip and they are affixed to the semiconductor chip with an adhesive tape. The adhesive tape has a carrier sheet of aluminum oxide and an adhesive layer applied on both sides of the carrier sheet.

11 Claims, 3 Drawing Sheets

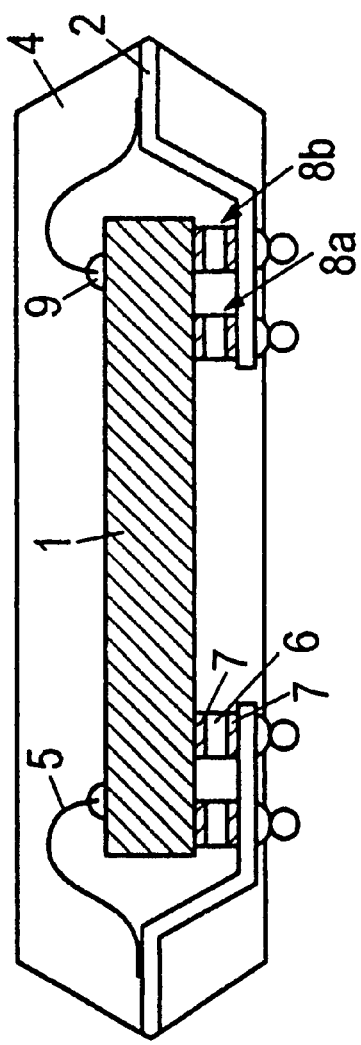
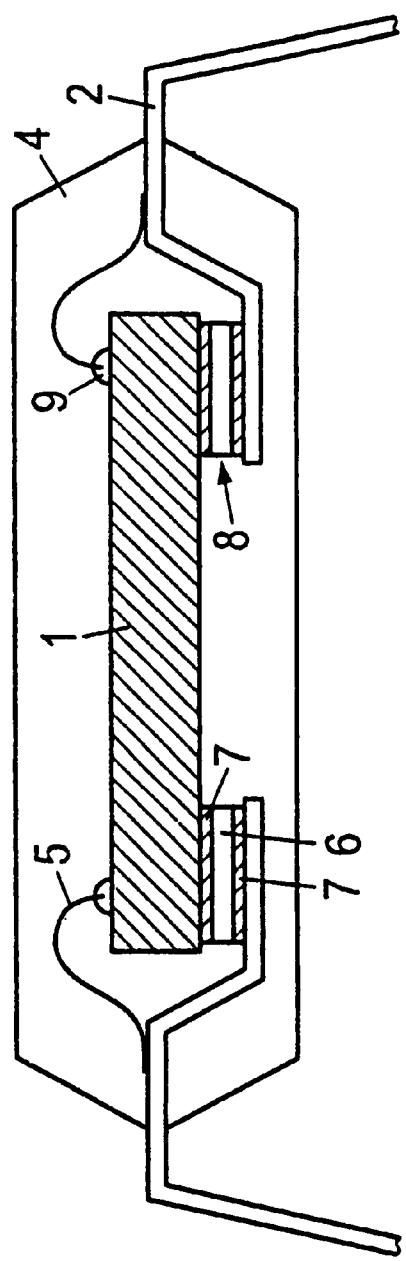

SEMICONDUCTOR ELEMENT HAVING A CARRYING DEVICE AND A LEAD FRAME AND A SEMICONDUCTOR CHIP CONNECTED THERETO

BACKGROUND OF THE INVENTION

Field of the Invention

The invention relates to a semiconductor component having a lead frame and a semiconductor chip connected thereto.

Surface mounted electronic components, also called SMD components, are usually embedded in a housing made of a plastic molding compound. Electrical connecting leads are routed out from the housing. There are a large number of different housing designs which are of different sizes and have a different number of connections. For semiconductor memories, for example 16 megabyte semiconductor memories, it is possible to use so-called TSOP housings (TSOP=thin small outline package) with a housing thickness of about 1 mm or else so-called SOJ housings (SOJ=small outline j-leaded) with a housing thickness of about 2.5 mm. These types of housings, like other DRAMs are frequently manufactured using the so-called LOC technique (LOC= lead-on-chip). The housing connections are in this case routed from two opposite sides across the semiconductor chip, the housing connections being part of a lead frame. The semiconductor chip has contact areas on which the connection elements are fixed by means of an adhesive tape. The adhesive tape, the so-called LOC tape, comprises a carrier sheet made of polyimide to which a thermoplastic adhesive is applied on both sides. The contact areas on the semiconductor chip in this case serve only for mechanical fixing of the semiconductor chip to the lead frame, while the electrical connection is effected for example via gold wires to bonding pads formed on the surface of the semiconductor chip. The adhesive tape is firstly applied to the lead frame, then the combination of lead frame and LOC tape is pressed onto the semiconductor chip and the adhesive bond is cured. The tape may be designed as a so-called full tape, that is to say the regions of the connection elements which overlap the semiconductor chip are completely covered by an adhesive layer and fixed on the semiconductor chip.

Another possibility for establishing the connection is the use of a so-called partial tape. That means that only a small part of the region which overlaps the semiconductor chip is fixed by means of an LOC tape with the semiconductor chip. In this case, the LOC tape is designed in narrow strips and is applied in the transverse direction across the connection elements. After the lead frame and semiconductor chip have been mechanically connected to one another, electrical contact is made between the bonding pads and the connection elements. In this case, the bonding pads are situated on the same side of the semiconductor chip on which the fixed connection elements of the lead frame are situated. The semiconductor device is subsequently encapsulated with a molding compound.

The LOC tape used to fix the connection elements usually comprises a polyimide sheet to which a thin adhesive layer is applied on both sides. A disadvantage when using a polyimide sheet as carrier layer is the complicated processing in order to coat the adhesive on the polyimide sheet. In order to ensure reliable adhesion of the adhesive layer on the polyimide sheet, surface activation of the carrier sheet chemically or by means of a so-called corona discharge is necessary. In this process, radicals are produced (or provoked) on the surface and then enable optimum binding of the adhesive. This process step is highly work-intensive and expensive since a large number of parameters have to be accurately coordinated with one another in order to ensure reliable adhesion between adhesive and polyimide sheet and also to avoid delamination of adhesive layer and carrier sheet during use. It is disadvantageous, moreover, that the carrier sheet tends to absorb moisture. At the high temperatures occurring in the further processing steps, it is possible, therefore, for vaporous cavitation and delamination to occur, which can lead to the reliability of the semiconductor module being impaired. Poor matching of the thermal expansion coefficient of the adhesively covered polyimide sheet (approximately 55 ppm/K) to the overall system can additionally reinforce the delamination effect. By comparison, the thermal expansion coefficient of the lead frame is approximately 4.2 . . . 18 ppm/K, the thermal expansion coefficient of the molding compound is approximately 10 . . . 17 ppm/K, while the thermal expansion coefficient of the semiconductor chip is approximately 3 . . . 5 ppm/K.

SUMMARY OF THE INVENTION

It is accordingly an object of the invention to provide a semiconductor component, which overcomes the above-mentioned disadvantages of the heretofore-known devices and methods of this general type and in which good adhesion between the connection elements and the semiconductor chip is ensured, whereby a LOC tape is used to fix the connection elements on the semiconductor chip.

With the foregoing and other objects in view there is provided, in accordance with the invention, a semiconductor component, comprising:

a semiconductor chip with contact pads on a top surface thereof;

connection elements overlapping the semiconductor chip, and bonding wires electrically connected between the connection elements and the contact pads; and adhesive tape connecting the connection elements to the semiconductor chip, the adhesive tape comprising a carrier sheet of aluminum oxide and an adhesive layer applied to both sides of the carrier sheet.

The semiconductor component is encased in a housing formed of a molding compound that surrounds the semiconductor chip and through which the connection elements are routed out for contacting.

In other words, there is provided a semiconductor component with a semiconductor chip, connection elements and a housing made of molding compound. The connection elements overlap the semiconductor chip and they are connected to the semiconductor chip by adhesive tape. The adhesive tape has a carrier sheet made of aluminum oxide to which an adhesive layer is applied on both sides of the sheet. The carrier sheet may also comprise a core made of aluminum with a surrounding layer of aluminum oxide. The advantages of the invention result from the properties of the adhesive tape, the so-called LOC tape. The use of the LOC tape with a carrier sheet composed of aluminum oxide ensures that the connection elements are electrically insulated from the surface of the semiconductor chip. A further advantage when using aluminum oxide as carrier sheet in comparison with a polyimide sheet consists in the fact that better processability is afforded during stamping. Good adhesion of the adhesive layer is ensured by the porous surface of the aluminum oxide, combined with a high surface adsorption tendency. In contrast to the polyimide sheet, surface activation, which is necessary in the case of the latter for good adhesion of the adhesive, is not necessary. It is precisely this manufacturing step which is highly work-intensive, since the parameters of the two components must be coordinated very accurately with one another. Furthermore, by comparison with the polyimide sheet, inclusion of moisture is precluded in the aluminum oxide. The risk of delamination is therefore reduced. Furthermore, the tape according to the invention has better matching of the thermal expansion coefficient to the overall system.

In accordance with an added feature of the invention, the adhesive tape is a strip-shaped tape, and wherein one strip extends along and parallel to each lateral edge of the semiconductor chip.

In accordance with an additional feature of the invention, a bank of the connection elements on one side are affixed to the semiconductor chip by two strips of the adhesive tape, a first one of the two strips extending along an edge of the semiconductor chip and a second one of the two strips extending along respective ends of the connection elements.

In the alternative, an overlap region of the semiconductor chip defined by an overlap of the connection elements may be completely covered with the adhesive tape.

With the above and other objects in view there is also provided, in accordance with the invention, an adhesive tape for fixing connection elements on a semiconductor chip. The tape comprises a carrier sheet of aluminum oxide having two sides, and an adhesive layer disposed on each of the two sides of the carrier sheet.

In accordance with yet another feature of the invention, the carrier sheet is an aluminum core and the adhesive layer is a layer of aluminum oxide completely surrounding the aluminum core.

In accordance with yet a further feature of the invention, the tape is electrically insulating.

In accordance with a concomitant feature of the invention, the adhesive layer is a thermoplastic layer.

The form of the LOC tape can be configured in a variety of ways. In an arrangement as a so-called full tape, the entire region of the semiconductor chip in which the connection elements overlap the latter is covered adhesively by the tape. This means that the connection elements are completely fixed to the semiconductor chip over their length along which they overlap said semiconductor chip. Reliable mechanical fixing of the semiconductor chip to the lead frame is thus ensured. In another embodiment, the tape has a strip form. These strips are bonded transversely across the connection elements, with the result that the tape is aligned parallel to the assigned chip edge after fixing on the semiconductor chip. In this case, it is possible to use just one tape strip per assigned chip edge; alternatively, it is possible for a plurality of tape strips to connect the connection elements to the semiconductor chip. A preferred embodiment has two tape strips which are fitted in such a way that one tape strip is fitted near the chip edge and the other tape strip is situated near the ends of the connection elements. The advantage of this arrangement consists in the fact that when the components are encapsulated by injection molding, good interlocking between the molding compound and the components is ensured.

Other features which are considered as characteristic for the invention are set forth in the appended claims.

Although the invention is illustrated and described herein as embodied in a semiconductor element having a carrying device and a lead frame and a semiconductor chip connected thereto, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a sectional view through a second embodiment of a semiconductor component according to the invention;

FIG. 5 is a sectional view through a third embodiment of a semiconductor component according to the invention.

DESCRIPTION OF THE PREFERRED EMBODIMENTS

Figure 1:
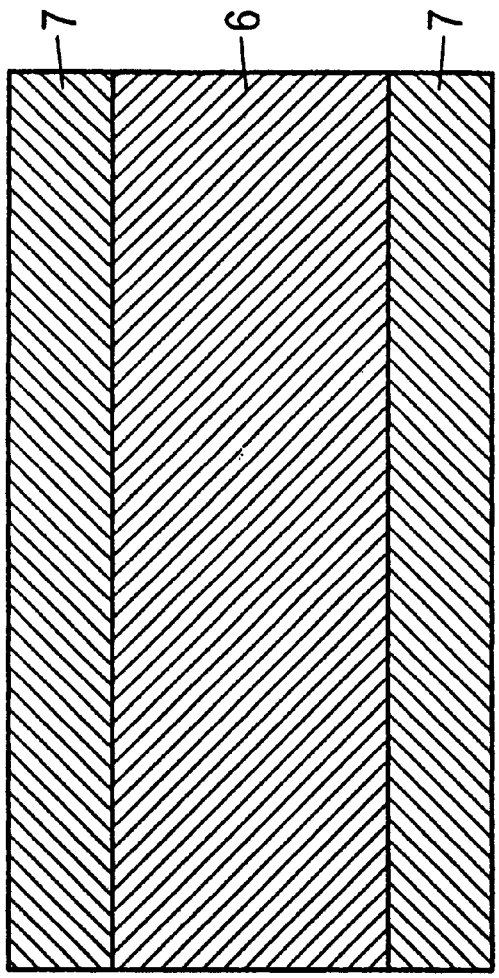
FIG. 1 is a sectional view taken through a LOC tape according to the invention.

Referring now to the figures of the drawing in detail and first, particularly, to FIG. 1 thereof, there is seen a section through an LOC tape according to the invention. A thermoplastic adhesive 7 is applied to both sides of a carrier sheet 6 made of aluminum oxide, for example by calender-coating. In this case, the carrier sheet 6 made of aluminum oxide is thicker than the thermoplastic adhesive 7 applied on both sides. The thickness of the LOC tape is in this case chosen such that the structural height of a finished semiconductor component, for example a memory module, becomes as small as possible. The thickness of the adhesive layers must ensure the necessary insulation between semiconductor chip and connection elements and, at the same time, ensure reliable adhesion. Possible unevennesses of connection elements or chip surface are compensated for by the adhesive. The thickness of each adhesive layer is approximately 20 µm; the thickness of the carrier sheet of aluminum oxide is between 30 and 50 µm.

Figure 2:
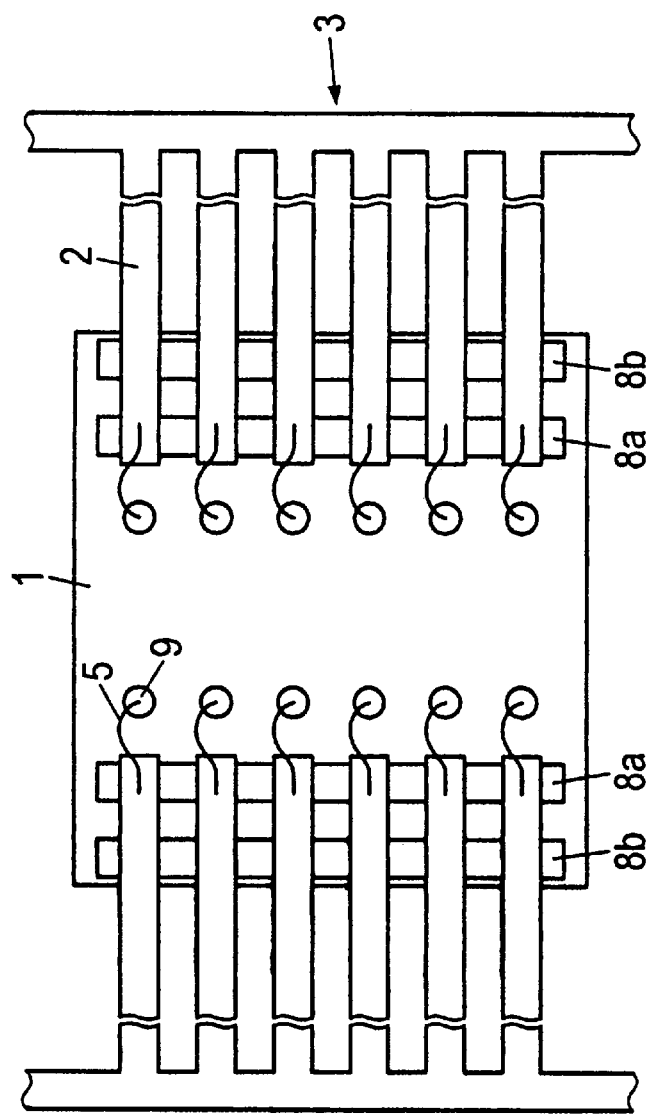
FIG. 2 is a plan view onto a semiconductor component according to the invention.

Referring now to the plan view of FIG. 2, there is shown a plan view of a semiconductor component in which the LOC tape according to the invention is used. The semiconductor component comprises a semiconductor chip 1, connection elements 2, which are part of a lead frame 3, and also bonding pads 9, which are fitted on the top side of the semiconductor chip 1 and are electrically connected to the connection elements 2 via bonding wires 5. In the form illustrated, the connection elements 2 overlap the top side of the semiconductor chip 1 at two opposite sides. The connection elements 2 are connected to the semiconductor chip 1 by means of an LOC tape 8a, 8b, which comprises a carrier sheet 6 made of aluminum oxide and a two-sided adhesive coating 7. In FIG. 2, the tape is designed as a so-called partial tape, that is to say the region in which the connection elements 2 overlap the semiconductor chip 1 is not completely covered adhesively with a whole-area tape, but rather only a partial region thereof. The tape 8a, 8b then has a strip form, for example. In the illustration, the connection elements 2 are connected to the semiconductor chip 1 by means of two tape strips 8a and 8b. In this case, the tape 8a is fitted at the ends of the connection elements 2, while the tape 8b fixes the connection elements 2 at the edge of the semiconductor chip 1. The two tape strips are in this case fitted on the connection elements 2 in such a way that the latter come to be situated parallel to the assigned chip edge. A surrounding molding compound is omitted, for the purpose of improved clarity.

Figure 3:
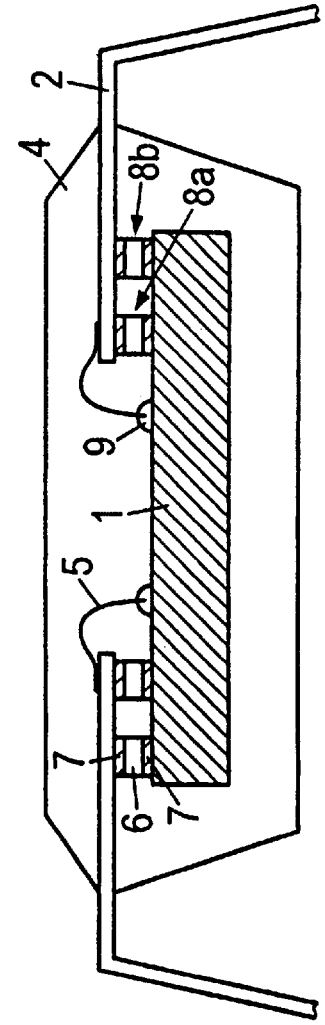
FIG. 3 is a vertical section taken through the semiconductor component of FIG. 2.

Referring now to the sectional view of FIG. 3, the semiconductor component comprises the semiconductor chip 1 and the connection elements 2 that overlap the semiconductor chip 1. The connection elements 2 are electrically connected to the bonding pads 9 situated on the top side of the semiconductor chip 1. The electrical contact is made via bonding wires 5, for example. The semiconductor chip 1 is mechanically fixed to the connection elements 2 in that the latter are connected to the semiconductor chip 1 by means of the adhesive tape 8a, 8b. The connection elements 2 are bonded by means of the tape 8a, 8b onto that side of the semiconductor chip 1 on which the bonding pads 9 are situated. The tape 8a, 8b comprises a carrier sheet made of aluminum oxide 6 and the adhesive layers 7 applied on both sides. In the figure, the tape is designed as a partial tape, that is to say the fixing of the connection elements 2 coming from a side is accomplished by means of two tape strips 8a, 8b, one tape strip 8a being fitted on the end of the connection elements 2 and the second tape being fixed on the edge of the semiconductor chip 1. When the components are encapsulated by injection molding, the molding compound can flow into an intermediate region and thus be fixedly interlocked with the components. In order to avoid or to reduce the risk of bulging or buckling of the semiconductor component, care must be taken to ensure that the semiconductor chip, after the encapsulation with molding compound, is surrounded on the respectively opposite sides by a layer of molding compound which has approximately the same thickness. After the injection-molding encapsulation with the molding compound, the connection elements 2 protrude laterally from the housing 4. The connection elements 2 can, for example, be bent downward and there be connected, for example, to a PCB (PCB=printed circuit board).

Referring now to the sectional illustration in FIG. 4 of a second embodiment with a novel LOC tape according to the invention, the second embodiment differs from the first variant according to FIG. 3 by the fact that the connection elements 2 are bonded onto the underside of the semiconductor chip 1. This is referred to as a so-called COL design (COL=chip on lead). The semiconductor component comprises the semiconductor chip 1, the connection elements 2, the bonding wires 5, which effect the electrical connection of connection elements 2 and semiconductor chip 1, the bonding wires 5 being fixed on bonding pads 9 situated on the top side of the semiconductor chip 1. The LOC tape 8a, 8b is applied to the underside of the semiconductor chip 1. The underside of the semiconductor chip 1 is that side which is opposite to the side to which the bonding pads 9 are applied. The connection elements 2 of the lead frame 3 are in this case routed under the semiconductor chip 1. The connection elements 2 overlap the semiconductor chip 1. As in the first exemplary embodiment, partial tape was used in this case too, that is to say the tape 8a, 8b has a strip form, one tape strip being fitted on the end of the connection elements 2 and the second tape strip being fixed on the edge of the semiconductor chip 1. The two strips are bonded across the connection elements 2 in such a way that the latter are applied parallel to the assigned side of the semiconductor chip. The electrical contact-making of the semiconductor component onto a substrate, for example PCB, is effected via the underside of the semiconductor component. In this case, the ends of the connection elements 2 on the underside protrude from the component encapsulated with molding compound and can be used for electrical contact-making. This housing design corresponds to a so-called BLP housing (BLP=bottom leaded plastic package).

FIG. 5 shows a third embodiment of a device according to the invention. In a manner corresponding to the other two configurations, the connection elements 2 overlap the semiconductor chip 1. In the form illustrated, these overlap on the underside, for which reason the connection elements 2 are bent downward. The semiconductor chip 1 is connected to the connection elements 2 by means of so-called full tapes, that is to say the region of the semiconductor chip 1 in which the connection elements 2 overlap the semiconductor chip 1 is completely covered adhesively with an LOC tape according to the invention. The electrical connection of semiconductor chip 1 and connection elements 2 is effected via bonding pads 9 situated on the top side of the semiconductor chip 1, these being connected by means of bonding wires 5 in a region of the connection elements 2 which does not overlap the semiconductor chip 1. After the encapsulation with the molding compound, connection elements 2 protrude laterally from the semiconductor component, from where further electrical contact can be made with them.

The use of an LOC tape with a carrier sheet made of aluminum oxide is common to all three embodiments. The use of an LOC tape with a carrier sheet made of aluminum oxide has the advantage not only of easier processing, for example in the course of stamping, but also that a work step is omitted when the adhesive is applied to the carrier sheet. In contrast to a polyimide sheet as carrier layer, it is not necessary to effect surface activation prior to the application of the adhesive in order to ensure good adhesion between carrier sheet and adhesive layer. Reliable adhesion of the adhesive on the carrier sheet is ensured on account of the porous surface of the aluminum oxide. These properties enable easy and costeffective manufacture, in the context of which know-how which is already known can be utilized during the manufacture of LOC tapes.

Likewise, existing machinery can be used during the manufacture of the LOC tapes and also of the semiconductor component. When aluminum oxide is used as carrier layer, moreover, delamination cannot occur since the carrier layer absorbs no moisture. Furthermore, on account of the smaller thermal expansion coefficient, better matching to the thermal expansion coefficients of the remaining components used is afforded. Furthermore, the use of the LOC tape according to the invention also ensures reliable electrical insulation between the connection elements and the surface of the semiconductor chip.

With a thermal expansion coefficient of approximately 10 ppm/K, better matching to the thermal expansion coefficients of the entire system is also afforded (for comparison, thermal expansion coefficient of the polyimide sheet is 55 ppm/K). The thermal expansion coefficient of the aluminum oxide sheet is better matched to the coefficients of the lead frame (4.2 . . . 18 ppm/K) and also of the molding compound (10 . . . 17 ppm/K). The thermal expansion coefficient of the semiconductor chip, with 3 . . . 5 ppm/K, is the only one that lies below the values of the other components.

Figure 6:
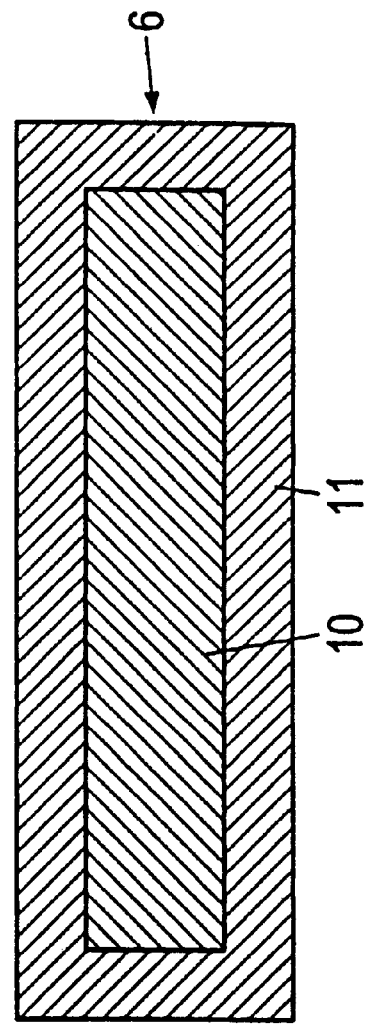
FIG. 6 is a sectional view taken through a carrier sheet according to the invention.

FIG. 6 shows a further embodiment of the carrier sheet 6. The sheet comprises a core made of aluminum 10 and a layer of aluminum oxide 11 surrounding the aluminum 10. The advantage of this embodiment is that the metallic core made of aluminum 10 effects electrical shielding.

We claim:

1. A semiconductor component, comprising:

a semiconductor chip with a plurality of contact pads on a top surface thereof;

a plurality of connection elements overlapping said semiconductor chip, and bonding wires electrically connected between said connection elements and said contact pads;

an adhesive tape connecting said plurality of connection elements to said semiconductor chip, said adhesive tape comprising a carrier sheet of aluminum oxide and an adhesive layer applied to both sides of said carrier sheet.

2. The semiconductor component according to claim 1, which further comprises a housing formed of a molding compound surrounding said semiconductor chip.

3. The semiconductor component according to claim 1, wherein said adhesive tape is a strip-shaped tape, and wherein one strip extends along and parallel to each lateral edge of said semiconductor chip.

4. The semiconductor component according to claim 1, wherein a bank of said plurality of connection elements are affixed to one side of said semiconductor chip by two strips of said adhesive tape, a first one of said two strips extending along an edge of said semiconductor chip and a second one of said two strips extending along respective ends of said connection elements.

5. The semiconductor component according to claim 1, wherein an overlap region of said semiconductor chip defined by an overlap of said plurality of connection elements is completely covered with said adhesive tape.

6. An adhesive tape for fixing connection elements on a semiconductor chip, comprising:

a carrier sheet of aluminum oxide having two sides, and an adhesive layer disposed on each of said two sides of said carrier sheet.

7. The adhesive tape according to claim 6, wherein said carrier sheet is an aluminum core and said adhesive layer is a layer of aluminum oxide completely surrounding said aluminum core.

8. The adhesive tape according to claim 6, wherein said tape is electrically insulating.

9. The adhesive tape according to claim 6, wherein said adhesive layer is a thermoplastic layer.

10. A semiconductor component, comprising:

a semiconductor chip with a plurality of contact pads on a top surface thereof;

a plurality of connection elements overlapping said semiconductor chip, and bonding wires electrically connected between said connection elements and said contact pads;

a non-conductive adhesive tape connecting said plurality of connection elements to said semiconductor chip, said adhesive tape comprising a carrier sheet of aluminum oxide and an adhesive layer applied to both sides of said carrier sheet.

11. A semiconductor component, comprising:

a semiconductor chip with a plurality of contact pads on a top surface thereof;

a plurality of connection elements overlapping said semiconductor chip, and bonding wires electrically connected between said connection elements and said contact pads;

an adhesive tape connecting said plurality of connection elements to said semiconductor chip, said adhesive tape comprising a carrier sheet of aluminum oxide and an adhesive layer applied to both sides of said carrier sheet, said adhesive tape not including a layer of polyimide.

* * * * *